United States Patent [19]
Partovi et al.

[11] Patent Number: 5,253,203
[45] Date of Patent: Oct. 12, 1993

[54] SUBARRAY ARCHITECTURE WITH PARTIAL ADDRESS TRANSLATION

[75] Inventors: Hamid Partovi, Westboro; Michael A. Case, Grafton, both of Mass.

[73] Assignee: Digital Equipment Corporation, Maynard, Mass.

[21] Appl. No.: 2,689

[22] Filed: Jan. 11, 1993

Related U.S. Application Data

[63] Continuation of Ser. No. 508,082, Apr. 11, 1990, abandoned.

[51] Int. Cl.⁵ .............................................. G11C 7/00
[52] U.S. Cl. ........................... 365/189.02; 365/189.01; 365/230.02
[58] Field of Search .............. 365/189, 189.01, 189.02, 365/230.02, 230.03, 51, 63; 364/200 MS File, 900 MS File

[56] References Cited

U.S. PATENT DOCUMENTS

| | | | |
|---|---|---|---|
| 4,384,342 | 5/1983 | Imura et al. | 364/900 |
| 4,663,742 | 5/1987 | Andersen et al. | 365/189 |
| 4,675,845 | 6/1987 | Itoh et al. | 365/51 |
| 4,694,433 | 9/1987 | Weidmann | 365/230 |
| 4,758,993 | 7/1988 | Takemae | 365/222 |
| 4,803,621 | 2/1989 | Kelly | 364/200 |
| 4,894,770 | 1/1990 | Ward et al. | 364/200 |
| 4,905,188 | 2/1990 | Chuang et al. | 364/200 |
| 4,926,386 | 5/1990 | Park | 365/230.03 |
| 4,928,266 | 5/1990 | Abbott et al. | 365/189.01 |
| 4,941,129 | 7/1990 | Oshima et al. | 365/230.03 |
| 5,014,235 | 5/1991 | Morton | 364/900 |
| 5,097,441 | 3/1992 | Cho et al. | 365/51 |
| 5,099,452 | 3/1992 | Yamakoshi et al. | 365/190 |

FOREIGN PATENT DOCUMENTS

| | | |
|---|---|---|
| 0025801 | 5/1983 | European Pat. Off. |
| WO80/02206 | 10/1980 | PCT Int'l Appl. |
| WO87/00339 | 1/1987 | PCT Int'l Appl. |

Primary Examiner—Joseph L. Dixon
Assistant Examiner—B. James Peikari
Attorney, Agent, or Firm—Arnold, White & Durkee

[57] ABSTRACT

The physical organization of a memory cell array in an integrated circuit cache memory system is different from its logical organization because the bit lines of the array are divided into segments to physically divide the memory cell array into sub-arrays, and multiplexing the bit line segments of groups of neighboring bit lines are multiplexed to respective data lines. "Early" address bits control row decoders which select a row of memory cells in each sub-array to assert data signals on the bit line segments in each sub-array. "Late" address bits control the multiplexing of the data signals on the bit line segments to the data lines. By segmenting the bit lines, the number of "late" address bits is increased relative to the number of "early" address bits to increase the memory access speed in data processing systems that employ virtual addressing but store data in cache memory in association with physical addresses. The "late" address bits, for example, are a translated portion of a virtual address translated by a translation buffer, and the "early" address bits are an untranslated portion of the virtual address. Routing problems are avoided by extending the data lines in parallel with the bit lines over regions of the integrated circuit substrate allocated to the memory cells in the array, and forming the data lines in a metalization layer separate from and over a metalization layer of the bit lines. Each data line is multiplexed to multiple bit line segments to eliminate a final multiplexer to input/output lines.

10 Claims, 9 Drawing Sheets

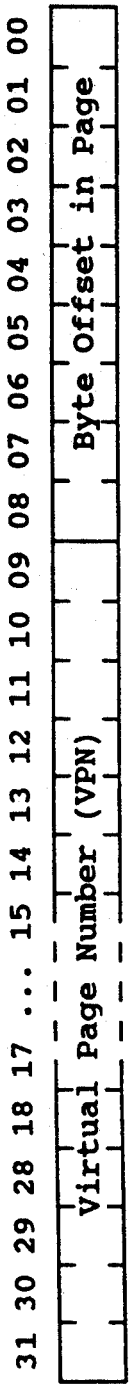
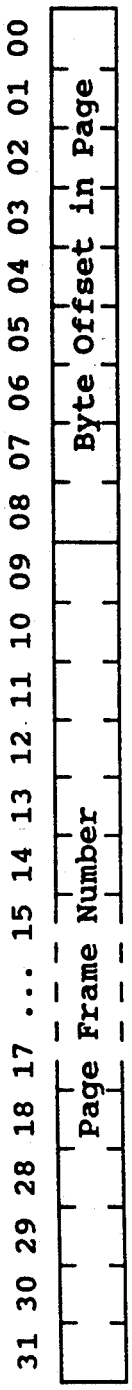
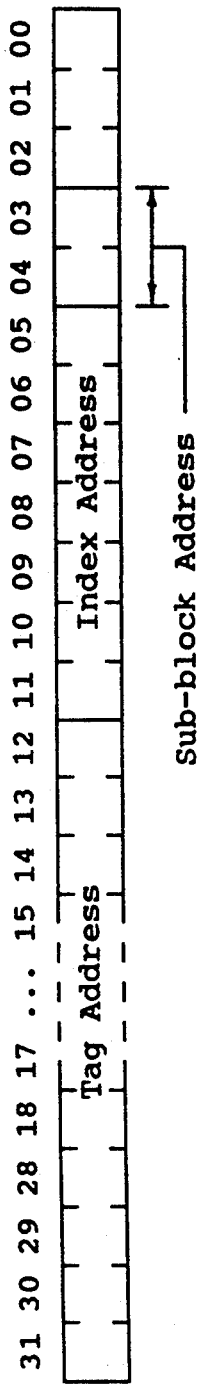

VIRTUAL ADDRESS: 31 30 29 28 18 17 .... 15 14 13 12 11 10 09 08 07 06 05 04 03 02 01 00
Virtual Page Number (VPN) | Byte Offset in Page PHYSICAL ADDRESS: 31 30 29 28 18 17 .... 15 14 13 12 11 10 09 08 07 06 05 04 03 02 01 00
Page Frame Number | Byte Offset in Page CACHE ADDRESSING: 31 30 29 28 18 17 .... 15 14 13 12 11 10 09 08 07 06 05 04 03 02 01 00
Tag Address | Index Address | Sub-block Address NOTE: Tag Address = Bits loaded into or compared with tag in the cache.
Index Address = Addresses a particular one of 128 indexes.
Sub-block Address = Adresses 1 of 4 aligned quadwords within the hexaword data block

FIG. 2

|   | | | LEFT BANK | | | | | | | | RIGHT BANK | | | | |
|---|---|---|---|---|---|---|---|---|---|---|---|---|---|---|---|
| 0: | A | TP | TAG | VB | QW3 | QW2 | QW1 | QW0 | TP | TAG | VB | QW3 | QW2 | QW1 | QW0 |
| 1: | A | TP | TAG | VB | QW3 | QW2 | QW1 | QW0 | TP | TAG | VB | QW3 | QW2 | QW1 | QW0 |
| 2: | A | TP | TAG | VB | QW3 | QW2 | QW1 | QW0 | TP | TAG | VB | QW3 | QW2 | QW1 | QW0 |
| 3: | A | TP | TAG | VB | QW3 | QW2 | QW1 | QW0 | TP | TAG | VB | QW3 | QW2 | QW1 | QW0 |
| ... | | | | | | | | | | | | | | | |
| 127: | A | TP | TAG | VB | QW3 | QW2 | QW1 | QW0 | TP | TAG | VB | QW3 | QW2 | QW1 | QW0 |

NOTE: A=     Allocation bit. Indicates whether the left or right bank was last allocated.
         TP=    1 bit of even tag parity.
        TAG=   20 bits of tag address.
         VB=    4 valid bits. Each bit corresponds to 8 bytes of data.
        QW=    8 bytes of data with 8 bits of even parity (72 bits total = 1 "quadword").

FIG. 3

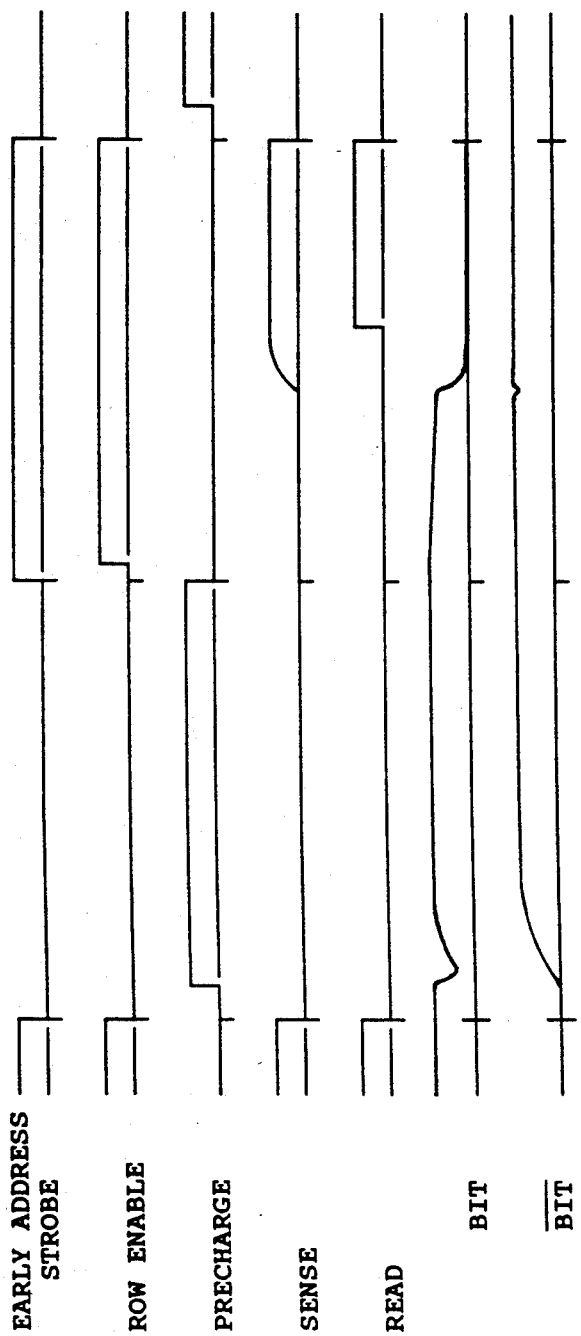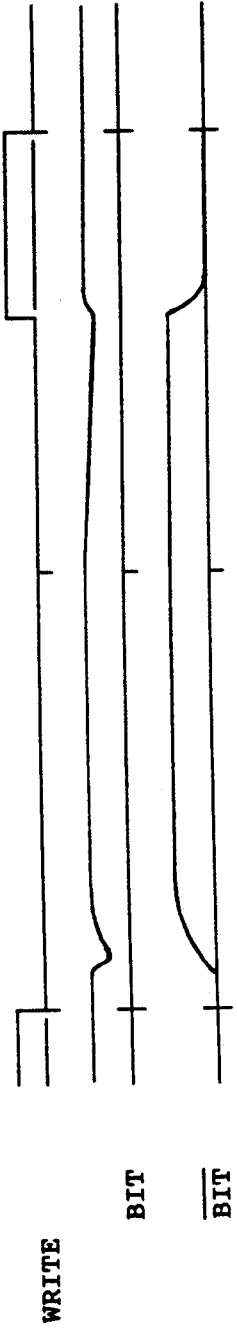
FIG. 10A
FIG. 10B

SUBARRAY ARCHITECTURE WITH PARTIAL ADDRESS TRANSLATION

This application is a continuation of application Ser. No. 07/508,082, filed Apr. 11, 1990, now abandoned.

BACKGROUND OF THE INVENTION

1. Field of the Invention

The present invention relates generally to semiconductor memories, and more particularly to large arrays of high-speed, high-density memory cells on semiconductor substrates. Specifically, the present invention relates to cache or associative memories that are addressed by virtual or translated addresses.

2. Background of the Invention

Advances in semiconductor processing techniques and improved memory cell designs have permitted semiconductor random access memory chips to be manufactured with an ever-increasing memory capacity in excess of one million bits. In general, the preferred construction of such a memory is a square array of rows and columns of memory cells. To address a bit of information, a row address is first transmitted to the memory chip along with a row address strobe signal. The row address is decoded to assert a signal on a "word line" extending across a selected row of memory cells. In response, each cell in the row asserts a stored information signal on a respective bit line extending along the cell's column in the array. During this time, a column address indicating an addressed bit line is transmitted to the memory chip along with a read or write signal. For a read operation, the information signal is read from the addressed bit line and asserted on an input/output line. For a write operation, an information signal from the input/output line is asserted on the addressed bit line and is written into the addressed memory cell.

For some special applications, such as associative or cache memories, a square array of memory cells does not match the required data organization. In these instances, rectangular memory arrays have been used, despite the natural preference for a square array.

SUMMARY OF THE INVENTION

In accordance with a basic aspect of the present invention, the physical organization of a memory cell array for a cache memory is made different from its logical organization by dividing the bit lines to divide the array into a plurality of sub-arrays of neighboring rows, the sub-arrays each having rows addressed by a plurality of row addresses, and having their respective bit line segments multiplexed to data lines extending over memory cells in the array. The data lines, for example, extend along the bit lines and are formed in a metalization layer separate from and over the metalization layer of the bit lines. The subdivision of the memory array into sub-arrays has the effect of decreasing the number of address bits needed to start cache access and increasing the number of "late" address bits that may arrive at a later time. When addressed by virtual or translated addresses, the speed of th storage system is increased because the additional "late" address bits are available only some time after the "early" address bits. In practice, this allows the construction of larger caches having higher hit rates without degraded performance due to "late" address bits.

In accordance with the method of the present invention, the cache memory is addressed by addressing a row of memory cells with an untranslated portion of the virtual address, translating a portion of the virtual address to obtain a translated address portion, and selectively connecting at least one bit line of the memory to at least one input/output line of the memory in response to the translated address portion. An increase in the speed of accessing the memory with a virtual address is obtained by translating of the virtual address in parallel with the addressing of rows of memory cells. The rows of memory cells, for example, are addressed at the same time that the virtual address is translated.

In a preferred physical organization, the sub-arrays are separated by rows of multiplexing elements which are selected to electrically connect the data lines to bit line segments in a selected one of the sub-arrays. The multiplexing elements are tristate or "wired-or" elements having outputs connected in parallel to the data lines. For reading or writing tag information, a respective multiplexing element electrically connects each data line to a respective bit line segment in the selected sub-array. In this case, the data line can be characterized as a "super-bit line" for the memory array. For reading or writing selected data within a cache block, a respective multiplexing element electrically connects each data line to a selected one of a number of neighboring bit line segments in the selected sub-array. This multiplexing arrangement facilitates the layout of the multiplexing circuitry.

BRIEF DESCRIPTION OF THE DRAWINGS

Other objects and advantages of the invention will become apparent upon reading the following detailed description and upon reference to the drawings in which:

FIG. 2 is a diagram showing components of virtual and physical addresses used in the cache memory system of FIG. 1;

FIG. 3 is a diagram showing the logical organization of the information stored in the cache memory;

FIG. 10A is a timing diagram showing various control signals used in the cache memory of FIG. 1;

FIG. 10B is a timing diagram similar to FIG. 10A but showing signals typical signals on the bit lines during a read cycle and during a write cycle;

Figure 1:
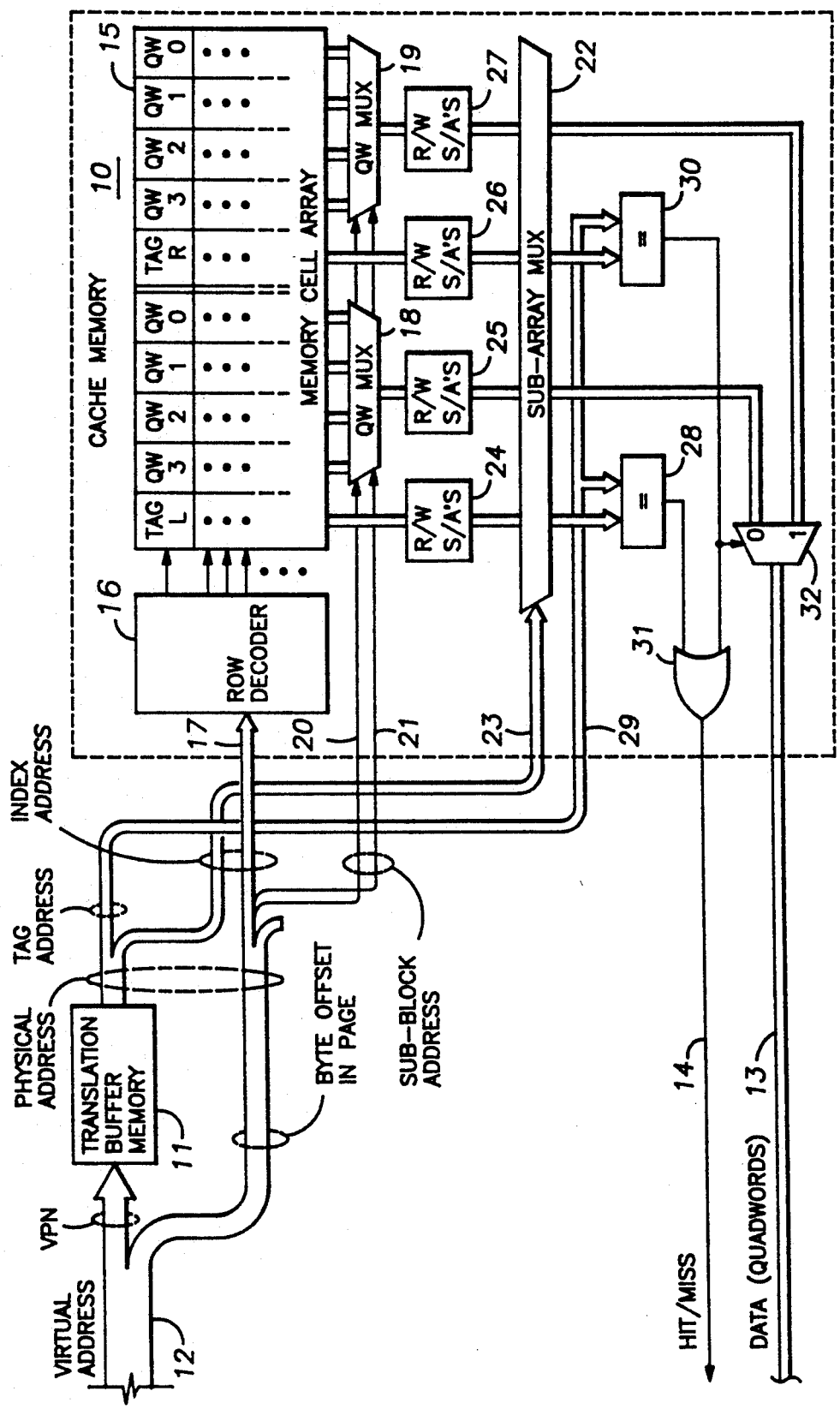
FIG. 1 is a block diagram of a cache memory employing the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

DESCRIPTION OF THE PREFERRED EMBODIMENT

Turning now to the drawings, there is shown in FIG. 1 a block diagram of a cache memory system employing the present invention. As is well known, cache memories are used to save cost in computer systems. If cost were no object, the entire memory system would be constructed from the fastest available memory. For low cost computers, this is obviously impossible. However, one option for less expensive systems is organizing the memory system into a layered hierarchy composed of different memory technologies. If this is done with a knowledge of the statistical characteristics and patterns of typical programs in execution, a significant increase in memory performance can be obtained at little added cost.

A common structure for a memory system having a layered hierarchy is the cache memory. In this scheme, a small high-speed buffer memory, called the cache, holds the most recently used instructions and data. When a program makes a memory request, the central processing unit first checks to see if the data are in the cache. If so, the data are brought quickly from the cache without using main memory.

When a cache memory is used in a computer system, it should be invisible to the user program. In other words, the user program should not directly address the individual locations in the cache memory, nor should it be concerned with the transfer of data from main memory to the cache when the desired data does not reside in the cache. These objectives are met by organizing the cache memory as an associative memory that stores data in association with information indicating main memory addresses from which the data are obtained.

To further benefit the programmer, it is common to provide a mechanism whereby the user program may reference a "virtual" address space larger or different from the physical address space of the main memory. If this is done, the user program is more easily transported from one computer system to another. In addition, the computer system typically provides a convenient mechanism that permits an operating system to change the correspondence between the virtual addresses in the user program and the physical addresses of the main memory. Such an address translation mechanism facilitates multi-tasking and time sharing by the operating system, because then it is very easy for the operating system to allocate and reallocate physical memory among various users of the computer system.

For further general background on the known construction and operation of cache memory and the translation of virtual addresses to physical addresses, one may refer to Levy and Eckhouse, J.R., *Computer Programming and Architecture*, The VAX 11, Digital Equipment Corporation, Maynard, Mass. (1980) pp. 351-364.

The cache memory system of FIG. 1 includes a cache memory generally designated 10 and a translation buffer memory 11 for permitting the cache memory 10 to be effectively addressed by virtual addresses. The virtual addresses are received on a bus 12 from a central processing unit (not shown), and data are exchanged between the cache memory 10 and the central processing unit over a bidirectional data bus 13.

Since the cache memory 10 stores, at a given time, only a relatively small portion of all of the data stored in main memory (not shown), the cache memory 10 provides a "hit/miss" signal on a line 14 to signal to the central processing unit that the addressed data has or has not been found in the cache memory. This hit/miss signal is returned to the central processing unit to signal a "cache miss" fault which is corrected by the central processing unit or the operating system. In particular, execution of the current instruction is halted while the main memory is accessed to obtain the data. When the data are conveyed from the main memory to the central processing unit, the data are also transferred to the cache memory 10. The transfer of data from the main memory to the cache memory 10 could be controlled by the operating system, or preferably it is controlled by a dedicated sequential state machine (not shown). Such control mechanisms are well known in the art.

Referring now to FIG. 2 in conjunction with FIG. 1, the preferred addressing of the cache memory 10 will be understood. The virtual address on the bus 12 includes 32 bits. Bits 9 to 31 define a virtual page number and bits 0 to 8 define a byte offset in a "page" of memory. Each byte referred to by the user program may have a distinct virtual address.

The virtual page number (VPN) is fed to a translation buffer memory 11 to generate a corresponding "page frame" number. The combination of the page frame number and the byte offset in the page makes up a 32-bit physical address.

The physical address is further broken down into a number of components for addressing the cache memory 10. These components include a tag address having bit positions 12 to 31, an index address having bit positions 5 to 11, and a sub-block address having bits 3 and 4. The tag address bits are compared with tags having been loaded in the cache during the transfer of data from main memory (not shown) to the cache. The index address addresses a particular one of 128 indexes in the cache. The sub-block address addresses one of four aligned quad words within the hexaword data block of the index.

The translation buffer 11 is organized as an associative memory to permit the operating system to change the correspondence between the virtual page numbers and the page frame numbers. The translation buffer 11, for example, is fully associative and it includes 96 virtual page number and associated page frame number entries. Each of the virtual page number entries is compared in parallel to the virtual page number on the bus 12. If a match occurs, the translation buffer memory outputs the associated page frame number entry. The physical construction or the size of the translation buffer memory, however, is not important to the present invention.

The functional organization of the cache memory 10 is depicted in FIG. 1. The cache is two-way set associative, meaning that it is broken down into a left bank and a right bank, each of which has tags and associated data blocks indexed by the index address. During a cache read or write, a first tag is read from the left bank and a second tag is read from the right bank. The two tags are each compared with the tag address to determine whether there is a cache hit in either the right or left bank. If a cache hit occurs in one of the banks, then the data is read from or written to the data block associated with the tag and indexed by the index address.

As more particularly shown in FIG. 1, the cache memory 10 includes an array 15 of rows and columns of memory cells. Each row of the memory cell array is selected by an output signal from a row decoder 16. The row decoder 16 decodes the portion of the index address which is not translated by the translation buffer memory 11. This untranslated portion of the virtual address 12 includes virtual address bits 5, 6, 7 and 8 which are transmitted over a bus 17.

When a row of the memory cell array is selected, data from that row are transmitted along the columns of the memory cell array to column multiplexers. As shown in FIG. 1, quad word multiplexers 18 and 19 are responsive to the sub-block address signals on lines 20 and 21 to select a particular one of the four quad words in the selected left and right bank data blocks. In addition, a sub-array multiplexer 22 is responsive to the translated portion of the index address. The translated portion includes physical address bits 9, 10 and 11 which are conveyed over a bus 23. The translated index column multiplexer selects the tag and a quad word from the cache blocks in the left and right banks selected by the row decoder 16. The output of the translated index column multiplexer 22 is therefore a tag and a selected quad word associated with the tag from the left bank, and a tag and selected quad word associated with the tag in the right bank. Preferably sense amplifiers or bidirectional data buffers 24, 25, 26 and 27 are disposed between the memory cell array 15 or quad word multiplexers 18, 19 and the sub-array multiplexer 22.

To determine whether there is a cache hit, a first comparator 28 compares the tag read from the left bank to the tag address received from the translation buffer memory 11 over a bus 29, and a second comparator 30 compares the tag read from the right bank to the tag address. Each comparator 28, 30, for example, includes twenty exclusive NOR gates, each of which compares a respective one of the twenty bits in the tag address to the corresponding bit from the tag read from the cache memory. The outputs of all of these exclusive NOR gates are logically summed to provide a cache hit signal. The comparator 28 provides a signal indicating whether there is a cache hit in the left bank of the cache memory, and the comparator 30 provides a signal indicating whether there is a cache hit in the right bank. The left and right cache hit signals are summed in a NOR gate 31 to provide the hit/miss signal asserted on the line 14. In addition, a data multiplexer 32 is responsive to at least one of the cache hit signals from the comparators 24, 26 to selectively connect the data bus 13 to either the left or right cache memory bank.

Turning now to FIG. 3, the information stored in the cache memory is further illustrated. Logically the cache memory is organized as 128 rows indexed by the index address. Each row includes a tag and a data block of four quad words in each of the left bank and the right bank. Stored in association with the two tags and the two data blocks in each row is an allocation bit (A) which indicates whether the left or right bank was last allocated. If the cache memory is accessed but a miss occurs, the allocation o bit is inspected to determine whether the cache block in the left or right bank should be replaced with new data received from the main memory. If the left bank was last allocated, then the right bank will be allocated this time to receive the new data. Otherwise, this time the left bank will be allocated to receive the new data. In the process of transferring the new data to the cache memory, the state of the allocation bit is switched.

Each row includes for each bank a tag parity bit (TP) and four valid bits (VB) in addition to the previously mentioned tag and four quad words. The tag parity indicates the parity of the tag and is used for error detection. Included in the tag comparators (28 and 30 in FIG. 1), for example, are parity checking circuits (not shown), and if a tag parity error is detected in one of the comparators, then the comparator will indicate that the tag address does not match the tag read from the cache memory. In addition, the parity error can be signaled to the central processing unit (not shown) for diagnostic and maintenance purposes.

Each of the four valid bits (VB) corresponds to one of the four quad words in each data block. By providing a valid bit for each of the quad words, the refilling of the cache is made more flexible because then it is possible to refill the cache block when only a portion of the data for the cache block is presently available from the main memory. In addition, during a context switch, all of the valid bits (together with all of the other bits except the data) are cleared in a "flush" operation to indicate that the data in the cache is not appropriate for the new context.

The logical organization of FIG. 3 suggests that the memory cell array should be organized as 128 rows and 627 columns. If such a memory were conventionally constructed, the rows would be selected by a row decoder receiving the seven bits of the index address to provide 128 row select signals. These row select signals would be applied to word lines in the memory cell array, and the accessed information would be received from the memory array via bit lines along the columns of the array. The inventors have discovered, however, that such a conventional memory array organization would unduly slow down the cache memory system where the cache stores physical address tags and the system is accessed by virtual addresses.

The memory access speed of the cache memory system is substantially improved by using the translated portion of the index address to operate a sub-array multiplexer rather than a row decoder. If row decoding requires only untranslated addresses, then the memory cells can be accessed and their bit lines can receive the stored information signals during the time that the translation buffer memory (11 in FIG. 1) is accessed to translate the virtual page number to obtain the page frame number. In a fairly optimum design, for example, the translated portion of the index address would be used to activate the sub-array multiplexer (22 in FIG. 1) at about the same time that the information is available from the bit lines of the memory cell array.

The memory organization as shown in FIGS. 1 and 3, however, presents a difficulty in the physical realization of the memory cell array as an integrated circuit. The row decoder 16 decodes only four address bits (bits 5, 6, 7 and 8), and therefore only provides sixteen distinct row select signals. Because each of the 128 rows in FIG. 3 includes 627 bits, a conventional organization of the memory cell array into 16 rows instead of 128 rows would require 5016 columns. Such a long and skinny memory cell array, having a length more than 240 times greater than its width, would be entirely unacceptable. Not only would the aspect ratio be undesirable, but means would be required for reducing transmission delay along the long word lines.

As will be further described below in connection with FIG. 8, the solution to this problem is to use an array of 128 rows, but the row decoder 16 selects simultaneously eight different rows, each of these eight rows being included in a separate sub-array of sixteen neighboring rows. This makes the multiplexing of the data from the columns more difficult, but this additional problem is solved by segmenting the bit lines and multiplexing the segmented bit lines to data lines that extend over memory cells in the array.

Figure 4:
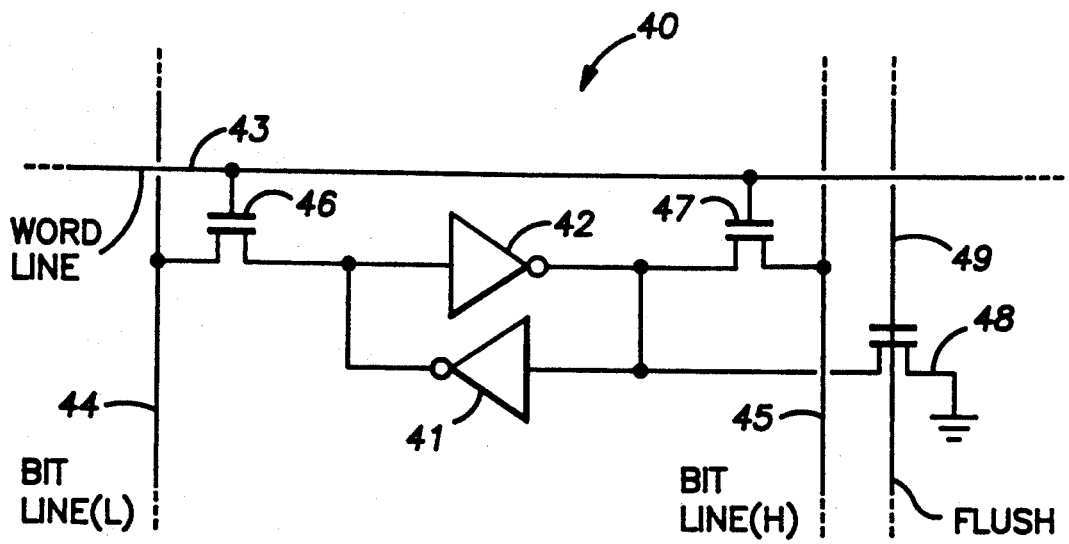
FIG. 4 is a schematic diagram of a memory cell in a CMOS embodiment of the cache memory of FIG. 1.

Turning now to FIG. 4, there is shown a schematic diagram of an individual memory cell in the memory cell array 15 of FIG. 1. In this example, the memory cell is a static CMOS six transistor arrangement. To form a bistable circuit holding either a logical one or a logical zero, the cell 40 includes a pair of interconnected inverters 41 and 42 disposed at the intersection of a word line 43 and a pair of complementary bit lines 44, 45.

For asserting stored information onto the complementary bit lines when the memory cell is addressed, the bit lines are connected to the outputs of the inverters 41, 42 through respective NMOS transistors 46 and 47 enabled by a select signal on the word line 43. In other words, when a word line receives a select signal active high from the row decoder (16 of FIG. 1), the inverters 41, 42 in each memory cell in the row including the word line are connected to their respective bit lines 44 and 45. One of the bit lines is discharged, and the other remains charged, in complementary fashion by the inverters 41 and 42. In addition, during a write operation, the bit lines are forced externally to complementary logic levels which may oppose the logic levels asserted by the inverters 41 and 42. In such a case, the external drive to the bit lines is much greater than the drive capability of the inverters 41 and 42 so as to force the logic levels of the inverters to the externally applied logic levels and to cause the logic states of the inverters to switch.

The memory cells for the valid bits each include an additional transistor 48 for clearing all of these memory cells in a parallel flush operation. When a signal is asserted on the flush line 49, the transistor 48 is driven into conduction to force the output of the inverter 42 to a logic low level. The transistor 48 is provided with a drive capability exceeding that of the inverter 42 to ensure that the memory cell's logic state will be switched if opposed by the inverter.

Figure 5:
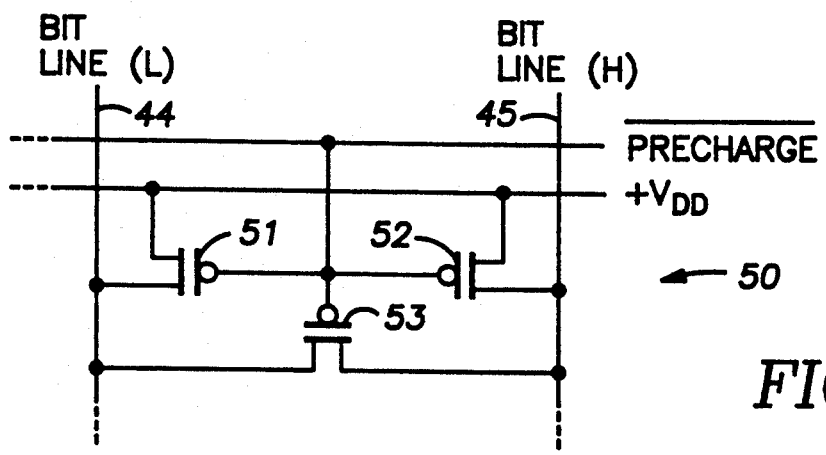
FIG. 5 is a schematic diagram of circuitry used for precharging the bit lines in the CMOS embodiment of the cache memory of FIG. 1.
Figure 6:
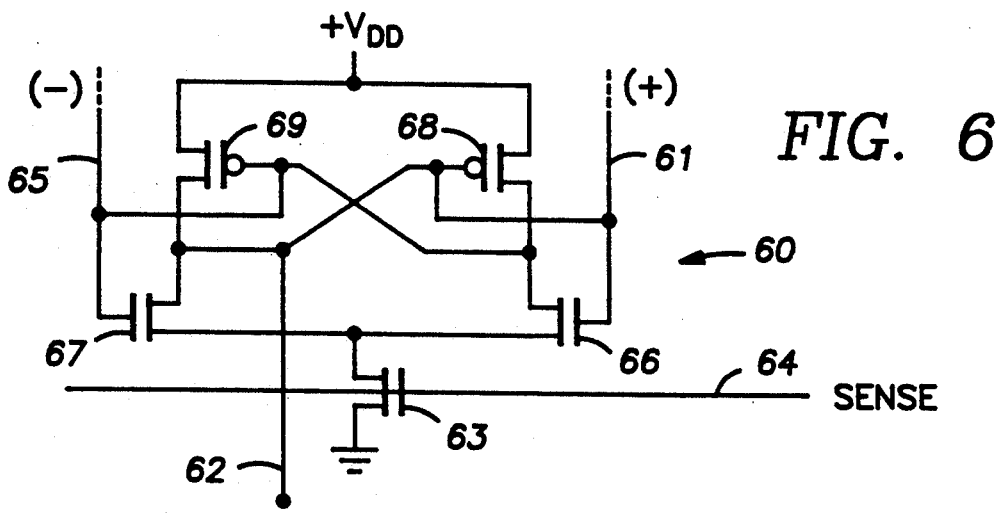
FIG. 6 is a schematic diagram of a sense amplifier for the CMOS embodiment of the cache memory of FIG. 1.

A column of memory cells is terminated by a precharge circuit 50 as shown in FIG. 5, and may also be terminated by a sense amplifier circuit 60 as shown in FIG. 6. It should be understood, however, that for the cache memory 10 of FIG. 1, the preferred array structure does not require sense amplifiers for the data bits because the bit line segments are sufficiently shortened that sense amplifiers are not needed for increasing the memory access speed for the data bits. The sense amplifiers can be omitted by replacing them in the drawings with a direct connection from their positive inputs 61 to their outputs 62. Sense amplifiers, however, are desirable for increasing the memory access speed of the tag bits by about 30% to compensate for the additional delay of the tag comparators (28 and 30 in FIG. 1).

The precharge circuit 5 is used to charge the bit lines 44, 45 to logic high levels (+VDD) prior to the addressing of the rows of memory cells. As shown in FIG. 5, the bit lines 44, 45 are charged to the logic high levels by a pair of PMOS transistors 51, 52. In addition, the bit lines are shorted together by a third PMOS transistor 53. After the bit lines are charged in this fashion, the word line select signal is asserted by the row decoder (16 in FIG. 1) to assert stored information signals on the bit lines.

The sense amplifier 60 senses the stored information signals asserted on the bit lines. As shown in FIG. 6, the sense amplifier 60 includes a current sinking transistor 63 that is slowly turned on by a logic high signal asserted on a sense line 64. The voltage difference between the bit lines 44, 45 is fed to positive and negative inputs 61, 65 of the sense amplifier, and the voltage difference is sensed by a differential pair of NMOS transistors 66 and 67. The differential transistors 66 and 67 are provided with respective PMOS load transistors 68 and 69. In effect, each NMOS transistor and its respective PMOS load transistor forms an inverter, and these two inverters have their inputs and outputs cross-coupled to provide a full logic swing once the transistor 63 is fully turned on by the sense signal.

Figure 7:
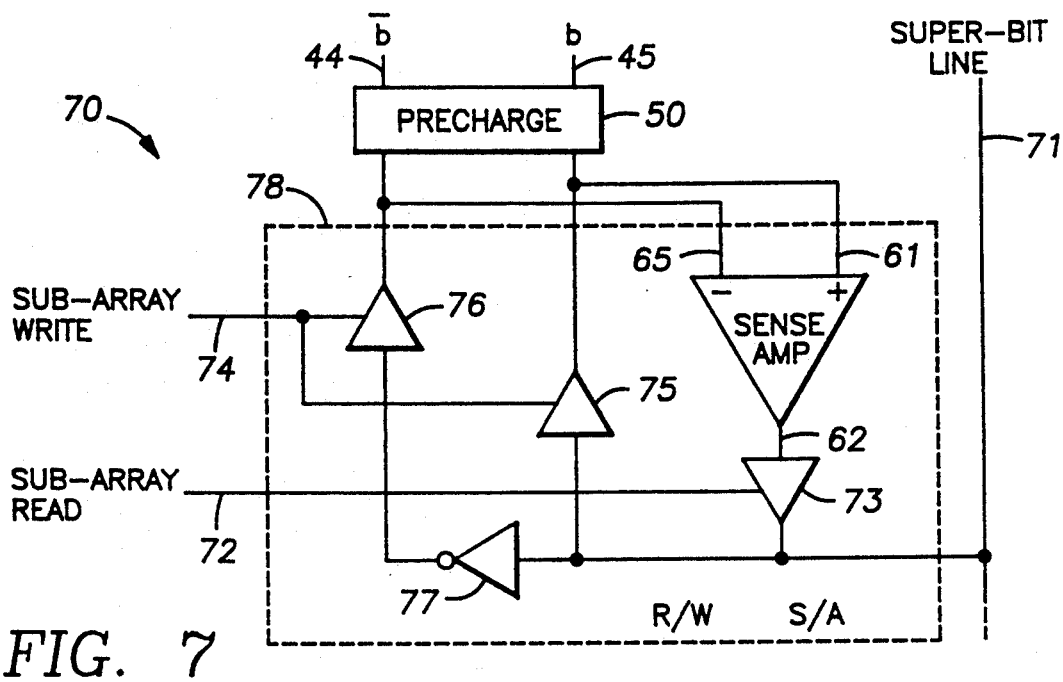
FIG. 7 is a schematic diagram of sub-array multiplexing circuitry for reading and writing tag information in the CMOS embodiment of the cache memory of FIG. 1.

Turning now to FIG. 7, there is shown the interconnection of the precharge circuit 50 and the sense amplifier 60 to form a multiplexing circuit 70 for an allocation bit, tag parity bit, or tag bit in the cache memory. This multiplexing circuit is bidirectional for reading or writing data to or from a "super-bit" data line 71. In response to a sub-array read signal on a control line 72, a driver 73 asserts the output of the sense amplifier 60 upon the data line 71. In response to a sub-array write signal on a control line 74, drivers 75 and 76 assert complementary signals on the bit lines 44 and 45. The driver 76 obtains the complement of the signal on the data line 71 from an inverter 77.

Figure 8:
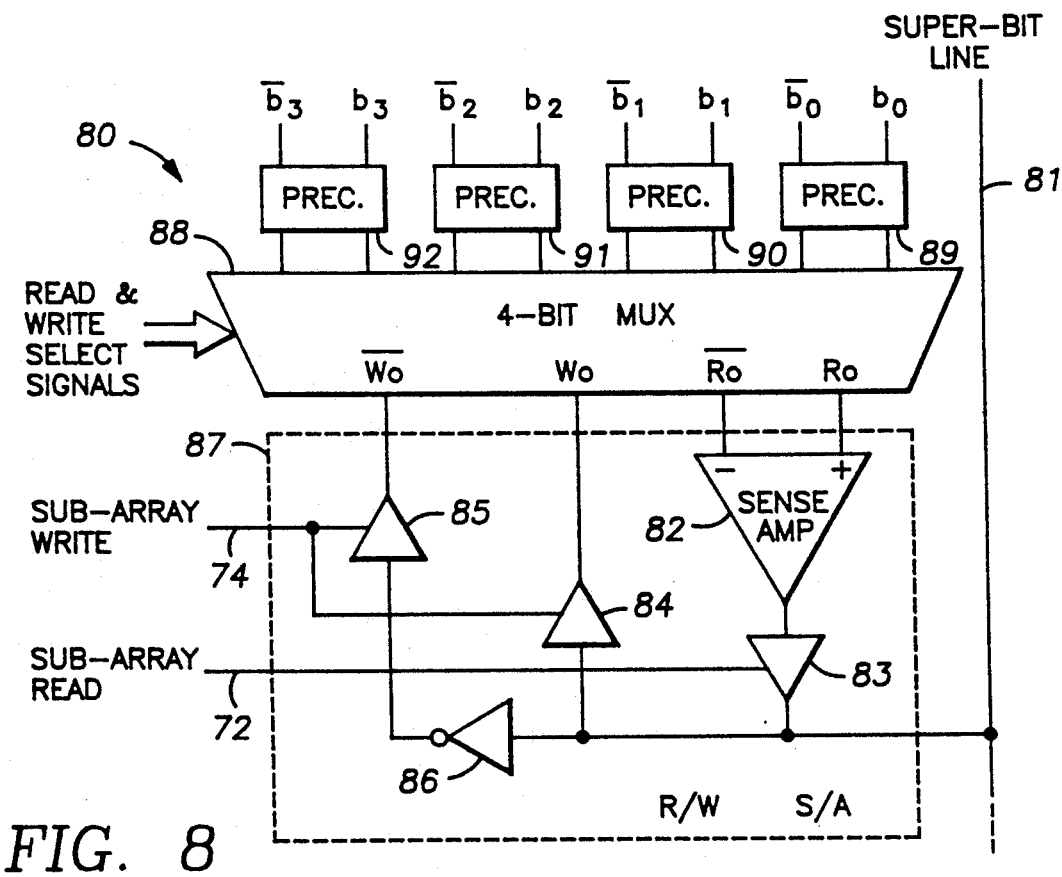
FIG. 8 is a schematic diagram of sub-array multiplexing circuitry for reading and writing a selected quad word from a cache block in the CMOS embodiment of the cache memory of FIG. 1.

Turning now to FIG. 8, there is shown a multiplexing circuit 80 for exchanging bits from the quad words in the cache memory with a "super-bit" data line 81. This multiplexing circuit uses a sense amplifier 82, drivers 83, 84, and 85, and an inverter 86 to form a "read-write" sense amplifier combination 87 similar to the combination 7 shown in FIG. 7. In addition, the multiplexing circuit includes a four-bit bidirectional multiplexer 88 interconnecting the "read-write" sense amplifier combination 87 to four precharge circuits 89, 90, 91, and 92 which terminate four pairs of neighboring complementary bit lines for bits $b_0$, $b_1$, $b_2$, and $b_3$.

Figure 9:
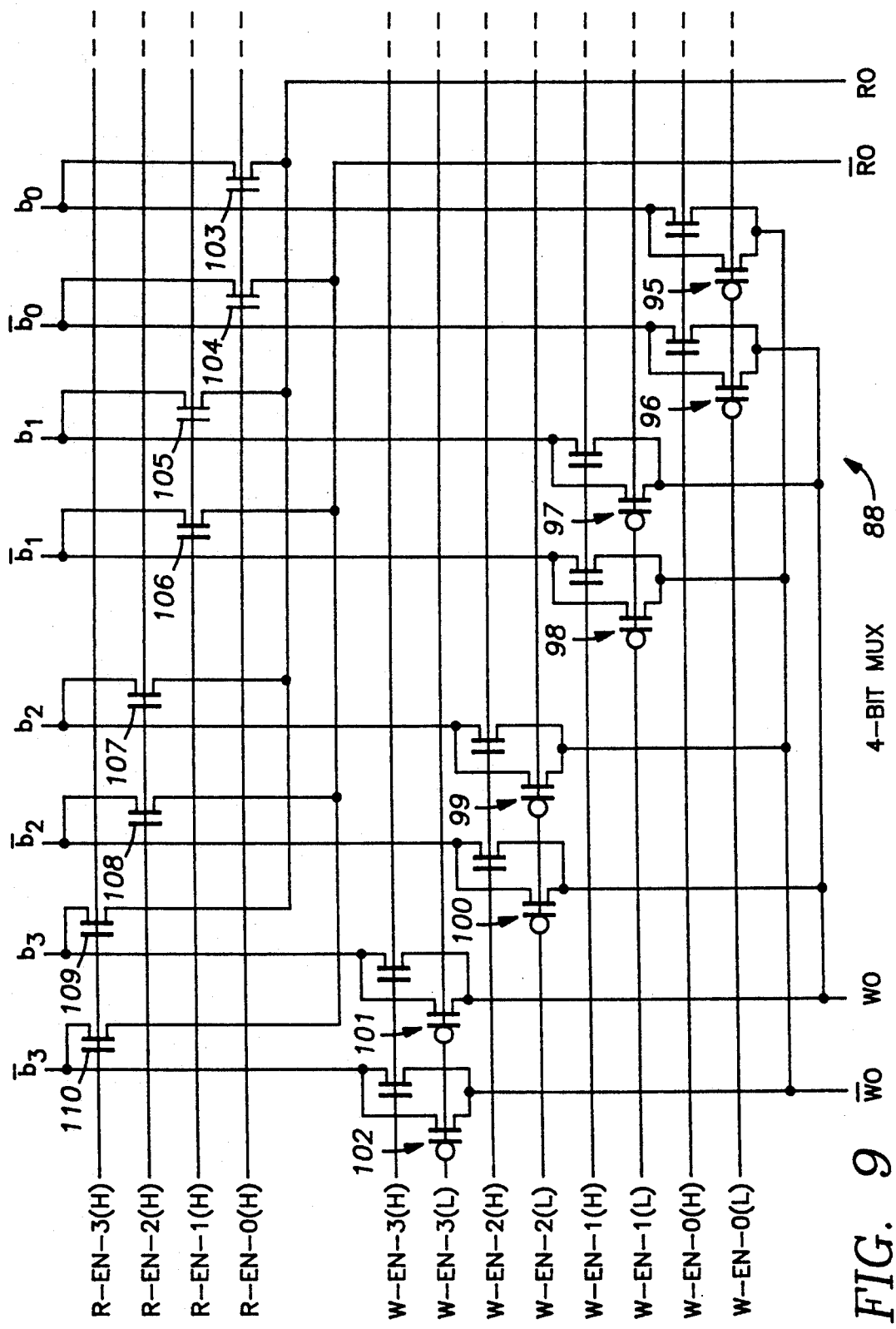
FIG. 9 is a schematic diagram of a four-bit bidirectional multiplexer used in the sub-array multiplexing circuitry of FIG. 8.

Turning now to FIG. 9, there is shown a schematic diagram of the four-bit multiplexer 88. Data is passed from a complementary write input ($W_0$, $\overline{W}_0$) to a selected pair of complementary bit lines by a selected pair of CMOS transmission gates 95, 96, 97, 98, 99, 100, 101, 102. For reading data from a selected pair of bit lines, however, CMOS transmission gates are not required. PMOS pass transistors can be used instead, and should be used if sense amplifiers were also used for the data bits. When sense amplifiers are not used for the data bits, it happens that NMOS pass transistors can be used instead of PMOS pass transistors, and the NMOS pass transistors may provide a shorter delay than PMOS pass transistors. Therefore NMOS pass transistors 103, 104, 105, 106, 107, 108, 109 and 110 are used in the four-bit multiplexer 88 for reading data from a selected pair of bit lines.

Turning now to FIG. 10A and 10B, there are shown timing diagrams which more clearly illustrates the sequence of the control signals for reading and writing cache data. The row addresses are stable when an "early address strobe" signal is asserted. Row address stability is ensured, for example, by latching the early address when the early address strobe is asserted. Once the early address strobe is asserted, a certain amount of time is required for the address signals to stabilize in the row decoder (16 in FIG. 1). Once the addresses in the row decoder have stabilized, the row decoder is enabled by a "row enable" signal. When the row enable signal is disabled, a certain amount of time is required for the inverters (41 and 42 in FIG. 4) in the memory cells in the selected row to be disconnected from the bit lines (44 and 45 in FIG. 4). After this certain amount of time, precharging of the bit lines is enabled by asserting a "precharge" signal. The precharge signal is deasserted when the row address strobe is asserted. This insures that the bit lines are not being precharged when a row of memory cells is selected, to prevent the precharge on the bit lines from causing contention with the inverters in the memory cells.

A rather substantial amount of time is required for a selected memory cell to assert an information signal on the bit lines, due to the fact that the bit lines have a fairly large amount of capacitance in relation to the drive capabilities of the inverters (41 and 42 in FIG. 4). The drive capabilities of the inverters are rather small due to the small size of the memory cells and due to the desire to write information to the cells by overpowering the inverter's drive capabilities. The sense signal is asserted after a differential voltage on the order of 250 millivolts is developed across the complementary bit lines. As shown in FIG. 6, for example, the sense signal is asserted at an intermediate point in time during the period when the row enable signal is asserted.

The sense signal is asserted rather slowly so as not to disturb the small differential margin of the sense amplifiers. When the sense signal is fully asserted, the sub-array read signal (on line 72 in FIGS. 7 and 8) is asserted to connect the sense amplifier to the "super-bit" data line (71 or 81 in FIG. 7 or FIG. 8) during a read operation. Alternatively, during a write operation, the sub-array write signal (on line 74 in FIGS. 7 and 8) is asserted instead of the read signal.

Figure 11:
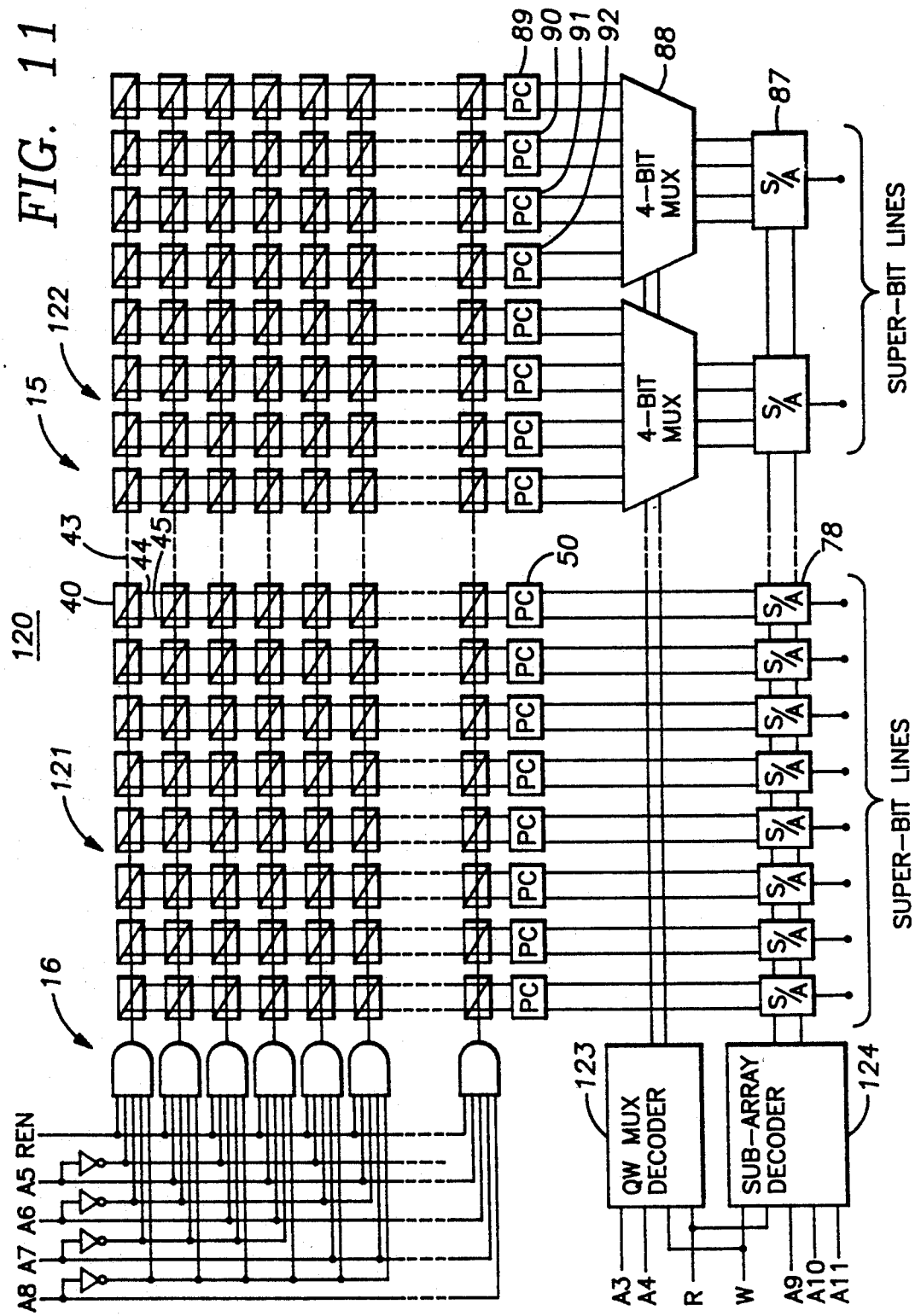
FIG. 11 is a schematic diagram of a memory cell sub-array and its interconnection to the decoding and multiplexing the cache memory of FIG. 1.

Turning now to FIG. 11, there is shown a schematic diagram of the interconnections between the row decoder 16, the memory cells 40, the read-write sense amplifier circuits 78, 87 and the four-bit multiplexers 88 making up a sub-array 120 of the cache memory 10. The word lines 43 extend along the rows of memory cells 40, and the bit lines 44, 45 extend along the columns of the memory cells. Segments of the bit lines 44, 45 are terminated by the precharge circuits 50, 89, 90, 91, 92.

In FIG. 11, the sub-array is shown subdivided into cells 121 for storing tags and cells 122 for storing quad words. The four-bit multiplexers for the quad words are controlled by control signals from a quad word decoder 123. The read-write sense amplifier circuits 78, 87 are controlled in unison by the sub-array read and write signals from a sub-array decoder 124.

Figure 12:
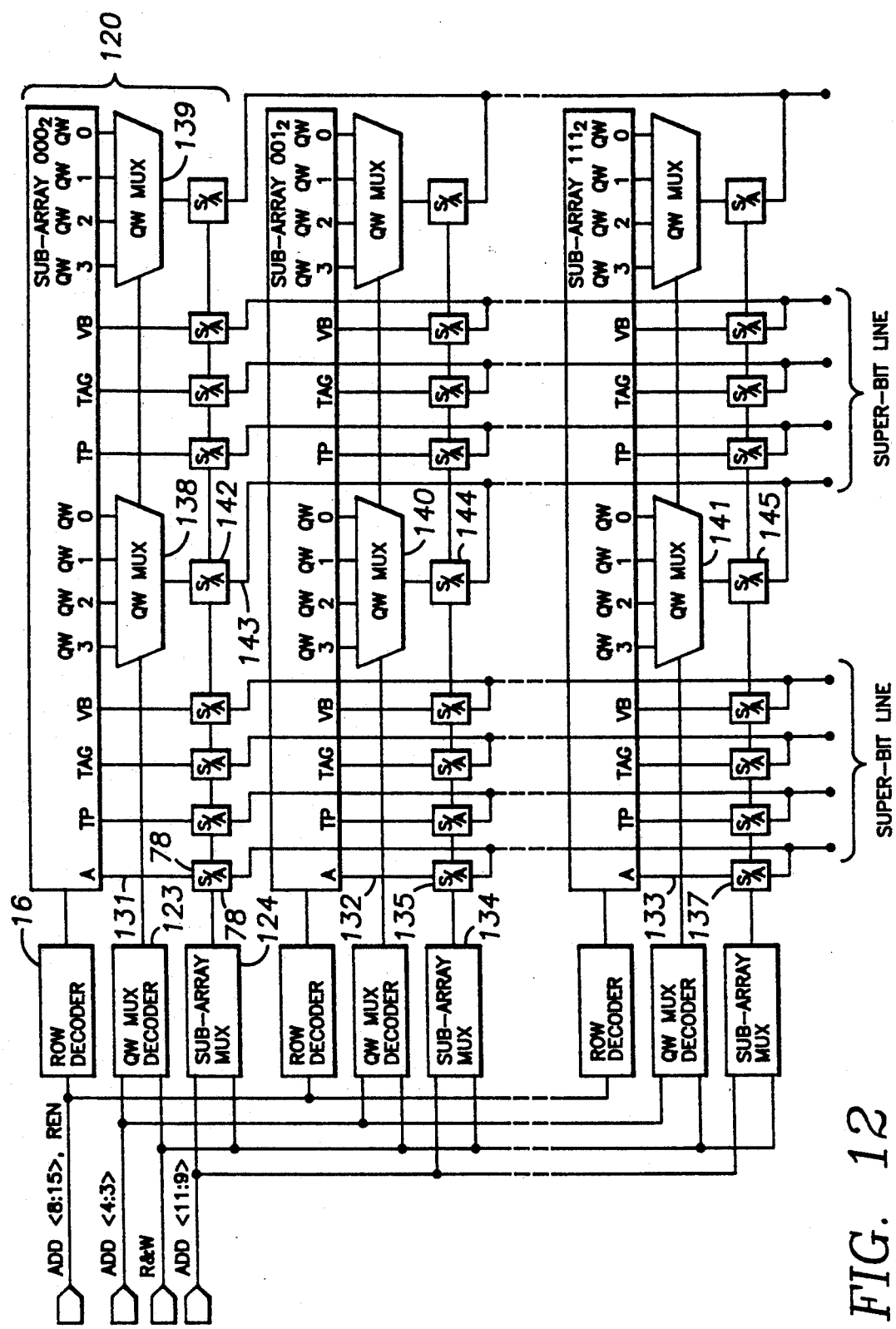
FIG. 12 is a schematic diagram showing the connections between the memory cell sub-arrays in the preferred physical organization of the cache memory of FIG. 1.

Turning now to FIG. 12, there is shown a schematic diagram of eight sub-array circuits 120 interconnected to form a combined memory cell array for use in the cache memory 10 of FIG. 1. It should be first noted that the single sub-array circuit 120 as shown in FIG. 11 could be used itself for the entire memory cell array 15. In this case, the memory cell array in FIG. 11 would extend in the row direction to include 5,016 columns. But this would make the array of memory cells unduly narrow in the column direction and long in the row direction. Instead, the memory cell array is broken down into eight sub-arrays $000_2, 001_2, \ldots 111_2$.

Physically, the overall memory cell array includes word lines extending across the columns of the arrays and bit lines extending along the columns of the array, but the bit lines are discontinuous between the sub-arrays. As shown in FIG. 12, for example, a first bit line for the allocate bit (A) has a bit line segment 131 for the memory cell sub-array $000_2$, a bit line segment 132 for the sub-array $001_2$, and a bit line segment 133 for the sub-array $111_2$. The memory, however, includes a number of "super-bit" data lines extending over memory cells in the array, and in particular extending over all of the sub-arrays except for the first sub-array $000_2$. In an alternative configuration (not shown), the "super-bit" data lines could intersect input-output lines (not shown) running along the row direction across the middle of the array, and in this case the "super-bit" data lines also would not extend over the last sub-array $111_2$.

The bit line segments are multiplexed to the "super bit" data lines in response to the sub-array address provided by the translated portion of the index address (bits 9, 10 and 11 of the physical address). In particular, the sub-array decoder 124 for the sub-array $000_2$ activates the read-write sense amplifier circuits 78 for the sub-array $000_2$ only when the address bits 11, 10, 9 are equal to 0, 0, 0. In a similar fashion, the sub-array decoder 134 for the second sub-array $001_2$ enables the read-write sense amplifier circuits 135 for the sub-array $001_2$ only when the address bits 11, 10, 9 are equal to 0, 0, 1. Likewise, the sub-array decoder 136 for the eighth sub-array $111_2$ enables the read-write sense amplifier circuits 137 for the eighth sub-array $111_2$ only when the address bits 11, 10, 9 equal 1, 1, 1.

Preferably, the cache memory 10 is an integrated circuit on a semiconductor substrate, and the "super-bit" data lines such as the line 71 are formed on a metalization layer separate from and overlaying a metalization layer in which the bit lines are formed. The data lines, for example, extend along neighboring bit lines to which they are multiplexed by the read-write sense amplifiers. The data line 71, for example, extends along and overlays the bit line segments 132 and 133. The data line 71 is multiplexed to the bit line segments 131, 132, and 133 by the read-write sense amplifiers 78, 135 and 137.

The four-bit multiplexers for the quad words in combination form a pair of quad word multiplexers for each sub-array. The sub-array $000_2$, for example, has associated with it a first quad word multiplexer 138 and a second quad word multiplexer 139. The output of the multiplexer 138, obtained from its associated bank 142 of read-write sense amplifiers, is wired in parallel over "super-bit" data lines with the outputs of a similar quad word multiplexer for each sub-array, such as the quad word multiplexer 140 via its associated bank 144 of read-write sense amplifiers for the sub-array $001_2$, and a quad work multiplexer 141 via its bank 145 of associate read-write sense amplifiers for the sub-array $111_2$.

The sub-arrays of memory cells are separated from each other by rows of multiplexing elements. The multiplexing elements in each row are selected and enabled by decoders in a fashion similar to the enabling of the memory cells in a row by the row decoders 16. But the decoders enabling the multiplexing elements can be supplied with "late" address bits that are delayed with respect to the row address bits. This permits an increase in the speed at which the cache memory may be accessed by a virtual address, because the sub-arrays of memory cells can be selected by the row decoders when a portion of the index address is being translated by the translation buffer. This also permits the size of the cache memory to be increased without decreasing the access speed of the memory, because the cache memory can be increased by adding additional subarrays. This just increases the number of late bits, without having an adverse effect on access speed in this cache memory configuration.

In view of the above, the physical organization of a memory cell array for a cache memory is made different from its logical organization by dividing the bit lines to divide the array into sub-arrays, and multiplexing the bit lines to data lines. By dividing the bit lines, the number of "late" address bits is increased relative to the number of "early" address bits to increase the memory access speed in systems employing virtual addressing. Routing problems are avoided by extending the data lines in parallel with the bit lines over memory cells in the array, and forming the data lines in a metalization layer separate from and over the metalization layer of the bit lines. Each data line is multiplexed to multiple bit line segments to eliminate a final multiplexer to input/output lines.

We claim:

1. An integrated circuit cache memory system on a semiconductor substrate, said cache memory system having an array of rows and columns of memory cells, word lines extending along the rows of memory cells, bit lines extending along the columns of memory cells, and an address decoder decoding row addresses to assert select signals on addressed ones of said word lines, each memory cell including means for asserting a stored information signal on the bit line along the column of said each memory cell when said address decoder asserts a select signal on the word line along the row of said each memory cell, said cache memory system having one set of outputs from some of said bit liens, and column multiplexing others of said bit lines to another set of outputs, wherein the improvement comprises said array being physically subdivided into a plurality of sub-arrays of neighboring rows of memory cells, the sub-arrays each having rows addressed by said row addresses, each bit line being discontinuous between the sub-arrays so that each bit line has a bit line segment extending along a column in each of the sub-arrays, and each of said memory cells in each column of each sub-array has a connection to the bit line segment extending along said each column of said each sub-array, and said memory system further including data lines for conveying information signals from said bit line segments to said outputs, said data lines extending over regions of said semiconductor substrate allocated to said memory cells without connections to said memory cells in the array, and said memory system further includes sub-array multiplexing means responsive to a sub-array address for multiplexing information signals on said bit line segments of an addressed one of said sub-arrays to said data liens, wherein said data lines include one data line connected to each output of said one set of outputs, said one data line connected to each output of said one set of outputs is multiplexed by said sub-array multiplexing means to the bit line segments of a corresponding one of said bit lines, said one data line connected to each output of said one set of outputs is parallel to and adjacent to said corresponding one of said bit liens, said data lines include one data line connected to each output of said another set of outputs, said one data line connected to each output of said another set of outputs is multiplexed by said sub-array multiplexing means to the bit line segments of a corresponding group of a plurality of neighboring ones of said bit lines, and said one data line connected to each output of said another set of outputs is parallel to and adjacent to one bit line in said corresponding group of a plurality of neighboring ones of said bit lines.

2. The cache memory system as claimed in claim 1, wherein none of said data liens extend over any regions of said semiconductor substrate allocated to one of the sub-arrays of memory cells, and each of said data liens extends over regions of said semiconductor substrate allocated to said memory cells in a respective column of said memory cells in each of the sub-arrays of memory cells other than said one of said sub-arrays of memory cells.

3. The cache memory system as claimed in claim 1, wherein said data lines are formed in a metalization layer separate from and overlaying a metalization layer in which the bit lines are formed.

4. The cache memory system as claimed in claim 1, further comprising a translation buffer memory for translating one portion of a virtual address to provide said sub-array address, and wherein said row address is another portion of said virtual address that is not translated by said translation buffer memory and that exists before said translation buffer memory translates said one portion of said virtual address.

5. The cache memory system as claimed in claim 1, wherein said memory is a read/write memory, and said column multiplexing means and said sub-array multiplexing means are bidirectional.

6. The cache memory system as claimed in claim 1, wherein said sub-array multiplexing means comprises a row of read-write sense amplifiers associated with each sub-array, the row of read-write sense amplifiers being in parallel with the rows of memory cells in the sub-array.

7. The cache memory system as claimed in claim 6, wherein each data line is connected to one of said read-write sense amplifiers in each row of read/write sense amplifiers.

8. An integrated circuit cache memory system on a semiconductor substrate, said cache memory system having an array of rows and columns of memory cells, word lines extending along the rows of memory cells, bit lines extending along the columns of memory cells, and an address decoder decoding row addresses to assert select signals on addressed ones of said word lines, each memory cell including means for asserting a stored information signal on the bit line along the column of said each memory cell when said address decoder asserts a select signal on the word line along the row of said each memory cell, said cache memory system having one set of outputs from some of said bit lines and column multiplexing means responsive to a column address for multiplexing others of said bit lines to another set of outputs, wherein the improvement comprises said array being physically subdivided into a multiplicity of sub-arrays of neighboring rows of memory cells, each bit line being discontinuous between the sub-arrays so that each bit line has a bit line segment extending along a column in each of the sub-arrays, and each of said memory cells in each column of each sub-array has a connection to the bit line segment extending along said each column of said each sub-array, and said memory system further including data lines for conveying information signals from said bit line segments to said outputs, said data lines extending over regions of said semiconductor substrate allocated to said memory cells without connections to said memory cells in the array, and said memory system further including sub-array multiplexing means responsive to a sub-array address for multiplexing information signals on said bit line segments of an addressed one of said sub-arrays to said data lines, wherein said data lines include one data line connected to each output of said one set of outputs, said one data line connected to each output of said one set of outputs is multiplexed by said sub-array multiplexing means to the bit line segments of a corresponding one of said bit liens, said one data line connected to each output of said one set of outputs is parallel to and adjacent to said corresponding one of said bit lines, said data lines include one data line connected to each output of said another set of outputs, said one data line connected to each output of said another set of outputs is multiplexed by said sub-array multiplexing means to the bit line segments of a corresponding group of a plurality of neighboring ones of said bit lines, and said one data line connected to each output of said another set of outputs is parallel to and adjacent to one bit line in said corresponding group of a plurality of neighboring ones of said bit lines, said memory is a read/write memory, said column multiplexing means and said sub-array multiplexing means are bidirectional, said sub-array multiplexing means comprises a row of read-write sense amplifiers being in parallel with the rows of memory cells in said each sub-array, and wherein each data line is connected to one of said read-write sense amplifiers in each row of read-write sense amplifiers, and said data lines are formed in a metalization layer separate from and overlaying a metalization layer in which the bit lines are formed.

9. The memory system as claimed in claim 8, further comprising a translation buffer memory for translating one portion of a virtual address to provide said sub-array address, and wherein said rows of memory cells are not selected by any translation of said virtual address by said translation buffer memory, and wherein said row address is provided by another portion of said virtual address that exists before said translation buffer memory translate said one portion of said virtual address.

10. An integrated circuit cache memory system on a semiconductor substrate, said cache memory system having an array of rows and columns of memory cells, word lines extending along the rows of memory cells, bit lines extending along the columns of memory cells, and an address decoder decoding row addresses to assert select signals on addressed ones of said word lines, each memory cell including means for asserting a stored information signal on the bit line along the column of said each memory cell when said address decoder asserts a select signal on the word line along the row of said each memory cell, said cache memory having one set of outputs from some of said bit lines, and column multiplexing means responsive to a column address for multiplexing others of said bit lines to another set of outputs, wherein the improvement comprises said array being physically subdivided into a multiplicity of sub-arrays of neighboring rows of memory cells, each bit line being discontinuous between the sub-arrays so that each bit line has a bit line segment extending along a column in each of the sub-arrays, and each of said memory cells in each column of each sub-array has a connection to the bit line segment extending along said each column of said each sub-array, and said memory system further including data lines for conveying information signals from said bit line segments to said outputs, said data lines extending over regions of said semiconductor substrate allocated to said memory cells without connections to said memory cells in the array, and said memory system further including sub-array multiplexing means responsive to a sub-array address for multiplexing information signals on said bit line segments of an addressed one of said sub-arrays to said data lines, wherein said data lines include one data line connected to each output of said one set of outputs, said one data line connected to each output of said one set of outputs is multiplexed by said sub-array multiplexing means to the bit line segments of a corresponding one of said bit liens, said one data line connected to each output of said one set of outputs is parallel to and adjacent to said corresponding one of said bit lines, said data lines include one data line connected to each output of said another set of outputs, said one data line connected to each output of said another set of outputs is multiplexed by said sub-array multiplexing means to the bit line segments of a corresponding group of a plurality of neighboring ones of said bit lines, and said one data line connected to each output of said another set of outputs is parallel to and adjacent to one bit line in said corresponding group of a plurality of neighboring ones of said bit lines, said memory is a read/write memory, said column multiplexing means and said sub-array multiplexing means are bidirectional, said sub-array multiplexing means comprises a row of read-write sense amplifiers being in parallel with the rows of memory cells in said each sub-array, and wherein each data line is connected to one of said read-write sense amplifiers in each row of read-write sense amplifiers, and further including a translation buffer memory for translating one portion of a virtual address to provide said sub-array address, said rows of memory cells not being selected by any translation of said virtual address by said translation buffer memory, and wherein said row address is provided by another portion of said virtual address that exists before said translation buffer memory translates said one portion of said virtual address.

* * * * *